United States Patent [19]

Yokota et al.

[11] Patent Number: 4,883,922

[45] Date of Patent: Nov. 28, 1989

[54] COMPOSITE SUPERCONDUCTOR AND METHOD OF THE PRODUCTION THEREOF

[75] Inventors: Minoru Yokota; Masayuki Nagata; Shigeo Saito; Yuichi Yamada, all of Osaka, Japan

[73] Assignee: Sumitomo Electric Industries, Ltd., Osaka, Japan

[21] Appl. No.: 193,525

[22] Filed: May 13, 1988

[30] Foreign Application Priority Data

| May 13, 1987 | [JP] | Japan | 62-117651 |
| May 13, 1987 | [JP] | Japan | 62-117652 |
| May 13, 1987 | [JP] | Japan | 62-117653 |
| May 13, 1987 | [JP] | Japan | 62-117654 |
| May 13, 1987 | [JP] | Japan | 62-117655 |
| May 13, 1987 | [JP] | Japan | 62-117656 |
| May 13, 1987 | [JP] | Japan | 62-117657 |
| May 13, 1987 | [JP] | Japan | 62-117658 |
| May 13, 1987 | [JP] | Japan | 62-117659 |
| May 13, 1987 | [JP] | Japan | 62-117660 |
| May 16, 1987 | [JP] | Japan | 62-119333 |

[51] Int. Cl.[4] .......................... H01B 12/00
[52] U.S. Cl. .................. 174/125.1; 335/216; 505/1; 505/886; 505/887
[58] Field of Search ............ 174/125.1; 335/216; 29/599; 505/884, 885, 886, 887, 809, 813, 917, 918

[56] References Cited

U.S. PATENT DOCUMENTS

| 3,372,470 | 3/1968 | Bindari | 505/884 X |
| 3,639,672 | 2/1972 | Kafka | 174/125.1 X |
| 3,730,967 | 5/1973 | Nicol | 505/887 X |
| 3,760,092 | 9/1973 | Woolcook et al. | 174/125.1 X |
| 3,763,552 | 10/1973 | Brown et al. | 174/125.1 X |
| 4,101,731 | 7/1978 | Marancik | 174/125.1 |
| 4,377,905 | 3/1983 | Agatsuma et al. | 174/125.1 X |
| 4,568,900 | 2/1986 | Agatsuma et al. | 335/216 |

FOREIGN PATENT DOCUMENTS 8002619 11/1980 PCT Int'l Appl. ............ 174/125.1

OTHER PUBLICATIONS

Jin, S. et al.; Fabrication of 91K Superconducting Coils; Materials Research Society; Proceeding of Sympossmim 1987, Spring Meeting; Apr. 23, 24, 87 Anaheim, California; pp. 219–221.

Kohno, Osamu et al., Critical Temperature and Critcal Current Density of La—Sr—Cu Oxide Wires; Japanese Journal of Applied Physics, vol. 26, No. 5, May. 1987, pp. L759–L760.

Yamada, Yutaka et al. Critical Current Density of Wire Type Y—Ba—Cu Oxide Superconductor; Japanese Journal of Applied Physics; vol. 26, No. 5, May 1987; pp. L865–L866.

*Primary Examiner*—Morris H. Nimmo
*Attorney, Agent, or Firm*—Wegner & Bretschneider

[57] ABSTRACT

A composite superconducting wire using ceramic superconductor material in which one or more elongated superconductor material are accomodated in one or more grooves formed on an elongated reinforcing member so that a long size superconductor wire can be provided. Various methods of producing such composite superconductor wire are also disclosed.

21 Claims, 22 Drawing Sheets

COMPOSITE SUPERCONDUCTOR AND METHOD OF THE PRODUCTION THEREOF

BACKGROUND OF THE INVENTION

1. FIELD OF THE INVENTION

The present invention relates to a composite superconductor and more particularly to a composite superconducting wire using ceramic superconductor material and the method of the production thereof.

2. DESCRIPTION OF THE PRIOR ART

As the superconductor material, metal superconductor, ceramic superconductor and organic superconductor are known.

It has been proposed to manufacture long superconductor wires and/or coils using superconductor material. Recently there have been found ceramic superconductors of high critical temperature and it has been discussed to manufacture superconductor wires and coils using the ceramic superconductor material.

Since the ceramic superconductor material is very brittle and treatment thereof is difficult, it has been considered difficult for those skilled in the art to manufacture ceramic superconductor long wires and coils. In order to solve the difficulty mentioned above, there has been a proposal that in view of the fact that the ceramic superconductor can be produced by sintering ceramic superconductor powder, the ceramic superconductor powder is filled in a metallic sheath, which is drawn or spun so as to provide an elongated superconductor wire with a desired diameter then the wire is subjected to a thermal process with a temperature higher than 990° C. for a few hours.

However, even if the ceramic superconductor covered by the metallic sheath is subjected to the thermal process, there occurs a shortage of elements such as oxygen for realizing the desired superconductor property and therefore, there occurs such a problem that the desired superconductivity can not be obtained.

If sufficient oxygen is supplied to the process, since the ceramic superconductor may be shrunk by the thermal processing, it is still difficult to manufacture long ceramic superconductor wires. Similarly, there is a problem of difficulty of manufacturing ceramic superconductor coils.

SUMMARY OF THE INVENTION

Before the description proceeds, it is to be noted that since the arrangement of the superconductor wire according to the present invention is made of an elongated reinforcement and one or more elongated ceramic superconducting members accommodated in one or more grooves defined in the reinforcing member, the term "elongated superconducting material" means the ceramic superconducting member to be accommodated or already accommodated in the groove or grooves and the term "composite superconducting wire" means the product of the superconducting wire according to the present invention.

An essential object of the present invention is to provide a composite superconducting wire using ceramic superconductor having a sufficient long size and a desired superconductor property.

Another object of the present invention is to provide a method of the production of the composite superconducting wire of a long size with a desired superconductor property.

According to the present invention, there is provided a composite ceramic superconducting wire made of an elongated reinforcing member and one or more ceramic elongated superconductor material accommodated in a groove or grooves defined on the elongated reinforcing member so as to extend generally in the longitudinal direction of the elongated reinforcing member.

The groove may be formed on the outer surface portion of the reinforcing member to extend linearly in the longitudinal direction of the elongated reinforcing member.

The groove may be formed in a spiral shape extending along the cylindrical surface of the reinforcing member.

The number of the groove is not limited to one but a plurality of grooves may be formed on the reinforcing member.

The ceramic elongated superconductor material may have the structure defined by the following equation.

$$A_a B_b C_c \qquad (1)$$

wherein A denotes at least one kind of the element selected from the IA group, IIA group, IIIA group of the periodic table, B denotes at least one kind of the element selected from the IB group, IIB group and IIIA group of the periodic table, and C denotes at least one kind of element selected from a group consisting of oxygen, fluorine, nitrogen, carbon and sulfur.

Examples of the IA group elements are Li, Na, K, Rb, Cs and Fr, and examples of the Ib group elements are Cu, Ag and Au.

Examples of the IIA group elements are Be, Mg, Ca, Sr, Ba and Ra, and examples of the IIb group elements are Zn, Cd and the like.

Examples of the IIIA group elements are Sc, Y and lanlhomides (e.g. La, Ce, Gd and Lu) and actinides (e.g. Ac Th, Pa and Cf), and examples of IIIA group elements are Al, Ga, In and Tl.

Among the above exemplified elements, those selected from the IB group elements, the IIA group elements, the IIIB group elements, and oxygen are preferred. Among the IB group elements, Cu and Ag are more preferred, particularly, Cu is most preferred.

As the examples of material of the reinforcing member, there may be used various kinds of material which are not reacted at the time of the thermal processing of the ceramic superconductor material and have a good thermal resistance at the thermal processing temperature. Examples of the material of the reinforcing member are stainless steel, Ag and the composite material of the stainless steel and Ag.

In the composite superconducting wire according to the present invention, since one or more grooves are defined on the peripheral portion of the elongated reinforcing member so as to extend in the longitudinal direction of the elongated reinforcing member and the elongated superconductor material is accommodated in the groove, the ceramic composite superconducting wire according to the present invention is easy to treat and can be manufactured as a very long superconducting wire even if the elongated superconductor material itself is brittle and hard to treat.

In addition, even if the ceramic superconductor material is shrunk during the sintering process, since the elongated superconductor material can be accommodated in the groove of the reinforcing member, the ceramic composite superconducting wire can be manufactured in a very long wire.

According to the present invention, there is provided method of the production of the ceramic composite superconducting wire.

In the first method, one or more elongated superconductor materials are accommodated in one or more grooves, each groove being formed on an elongated reinforcing member so as to extend in a longitudinal direction of the reinforcing member. Subsequently, the reinforcing member is covered with an outer pipe. Then the reinforcing member with the ceramic elongated superconductor material is subjected to a wire drawing process and the outer pipe is removed, thereby to obtain a superconducting wire, which is in turn subjected to a thermal treatment, whereby a ceramic composite superconducting wire can be obtained.

According to the first method, the ceramic elongated superconductor materials are accommodated in each groove, whereby the ceramic elongated superconductor materials can be made integral with the reinforcing member. By covering the reinforcing member with the ceramic elongated superconductor material by pipe, the elongated superconductor material and the reinforcing member can be tightly integrated. By drawing the reinforcing member covered by the pipe with the ceramic elongated superconductor material in the groove, a superconducting wire with a desired diameter can be obtained. Thereafter the pipe is removed and the superconducting wire is subjected to the thermal treatment for sintering under supply of suitable element or elements in order to obtain a desired superconductor property. By the sintering process, the ceramic superconductor material can be tightly integrated.

In the second method, one or more elongated ceramic superconductor materials are accommodated in the groove formed on an elongated reinforcing member for extending in s longitudinal direction. Subsequently, the reinforcing member is covered with an outer pipe. Then the reinforcing member with the ceramic superconductor material is subjected to a wire drawing process followed by a twisting process, then the outer pipe is removed to obtain a superconducting wire assembly which is in turn subjected to a thermal treatment, whereby a composite superconducting wire can be produced.

According to the second method, the ceramic elongated superconductor materials are accommodated in each groove, whereby the elongated superconductor materials can be made integral with the reinforcing member. By covering the reinforcing member with the elongated superconductor material with the pipe, the elongated superconductor material and the reinforcing member can be tightly integrated. By drawing the reinforcing member covered by the pipe with the elongated superconductor material in the groove, a superconductor wire with a desired diameter can be obtained. Thereafter the pipe is removed and the superconductor wire assembly is subjected to the thermal treatment for sintering under supply of suitable element or elements in order to obtain a desired superconductor property. By the sintering process, the elongated superconductor material can be tightly installed in the inner portion of the groove of the reinforcing member in a pressed manner.

In addition, by the twisting process, the reinforcing member and the elongated superconductor material are shaped in a spiral shape, whereby the superconductor wire with the elongated superconductor material is formed in the spiral shape so that the length of the composite superconducting wire can be increased.

In the third method, elongated superconductor materials are accommodated in a groove formed on an elongated reinforcing member for extending in s longitudinal direction. Subsequently, the reinforcing member is covered with an outer pipe. Then the reinforcing member with the elongated superconductor material is subjected to a wire drawing process followed by a process of coiling the reinforcing member with the ceramic elongated superconductor material in a coil shape (referred to as a coiling process), and the outer pipe is removed to obtain a superconductor wire assembly, which is in turned subjected to a thermal treatment, whereby a composite superconducting wire can be produced.

According to the third method, the elongated superconductor materials are accommodated in each groove, whereby the elongated superconductor materials can be made integral with the reinforcing member. By covering the reinforcing member and elongated superconductor materials with the pipe, the elongated superconductor material and the reinforcing member can be tightly integrated in the bottom of the groove of the reinforcing member. By drawing the reinforcing member covered by the pipe with the elongated superconductor material in the groove, a superconductor wire assembly with a desired diameter can be obtained. Thereafter the pipe is removed and the superconductor wire assembly is subjected to the thermal treatment for sintering under supply of suitable element or elements in order to produce a composite superconducting wire with a desired superconductor property. By the sintering process, the elongated superconductor material can be tightly integrated in the inner portion of the groove of the reinforcing member.

In the fourth method, elongated superconductor materials are accommodated in a groove formed on an elongated reinforcing member for extending in a longitudinal direction. Subsequently, the reinforcing member is covered with an outer pipe. Then the reinforcing member with the elongated superconductor materials is subjected to a wire drawing process followed by the twisting process and coiling process, and the outer pipe is removed to obtain a superconductor wire assembly, which is in turn subjected to a thermal treatment.

The material of the ceramic superconductor may be produced in such a manner that suitable raw material of the ceramic superconductor is preliminarily sintered and the sintered substance is broken into ceramic superconductor powder and the ceramic superconductor powder is accommodated in a suitable sheath to obtain a wire shape.

As the elongated superconductor material, there may be used a bundle of a plurality of ceramic superconductor filaments or twisted ceramic superconductor filaments. In this case, the filaments and/or the bundle of the filaments may be coated by a suitable coating material. Such coating material may be removed at the pipe removing process. As the examples of the coating material, there may be used Cu, Al, Ag. As the examples of the solvent for removing the pipe, any solvent may be selected corresponding to the material of the pipe, and there may be used nitric acid and sulfric acid.

The number and shape of the grooves for accommodating the elongated superconductor material may be decided as desired.

In case the groove for accommodating the elongated superconductor material is shaped in a spiral shape, it is possible to manufacture a coil of the superconductor wire and in case the groove is formed on the peripheral surface of the reinforcing member, the elongated superconductor material accommodated in the groove is pressed to the bottom of the groove due to shrinkage of the superconductor when the superconductor is sintered, whereby the elongated superconductor material can be held in the groove tightly.

In case a plurality of grooves are formed on the peripheral surface of the reinforcing member, the same technical effects as mentioned above can be attended.

In case the ceramic superconductor is formed by the material defined by the equation (1), the same effects may be attended.

In order to obtain the effects mentioned above, the reinforcing member may be formed by various kind of material so far as the material is not reacted at the time of thermal processing of the ceramic superconductor wire assembly and has an enough thermal resistivity for the thermal treating temperature.

In a further method, one or more elongated superconductor materials are accommodated in one or more grooves, each groove being formed on an elongated reinforcing member so as to extend in s longitudinal direction of the reinforcing member. Subsequently, the reinforcing member is covered with an outer pipe. Then the reinforcing member with the ceramic elongated superconductor material is subjected to a wire drawing process, thereby to obtain a superconducting wire covered with the outer pipe, which is in turn subjected to a thermal treatment, whereby a ceramic composite superconducting wire covered with the outer pipe can be obtained.

DETAILED DESCRIPTION OF THE PREFERRED EMBODIMENTS

Figure 1:
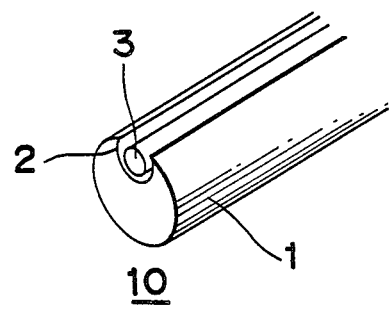
FIG. 1 is a perspective view showing an example of a superconductor wire according to the present invention.

Referring to FIG. 1 showing an example of the composite superconducting wire 10 according to the present invention, there is shown an elongated reinforcing member 1 made of stainless steel having a round shape in a sectional shape. An elongated groove 2 having a generally circular shape is defined on the cylindrical surface portion of the reinforcing member 1 so as to extend straight in a longitudinal direction of the reinforcing member 1. Elongated superconductor material 3 made of ceramic superconductor substance of $Y_1 Ba_2 Cu_3 O_{7-x}$ is accommodated in the groove 2 of the reinforcing member 1. In the composite superconducting wire shown in FIG. 1, since the brittle elongated superconductor material 3 is accommodated in the groove 2, namely the elongated superconductor material 3 is covered by the reinforcing member 1, it becomes possible for a man to touch the ceramic composite superconductor wire 10 and to bend it without any deterioration of the superconductor property. It is also possible to manufacture a long superconductor wire by making the reinforcing member long.

Figure 2:
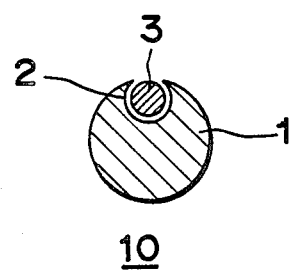
FIG. 2 is a cross sectional view of the superconductor wire shown in FIG. 1.
Figure 3:
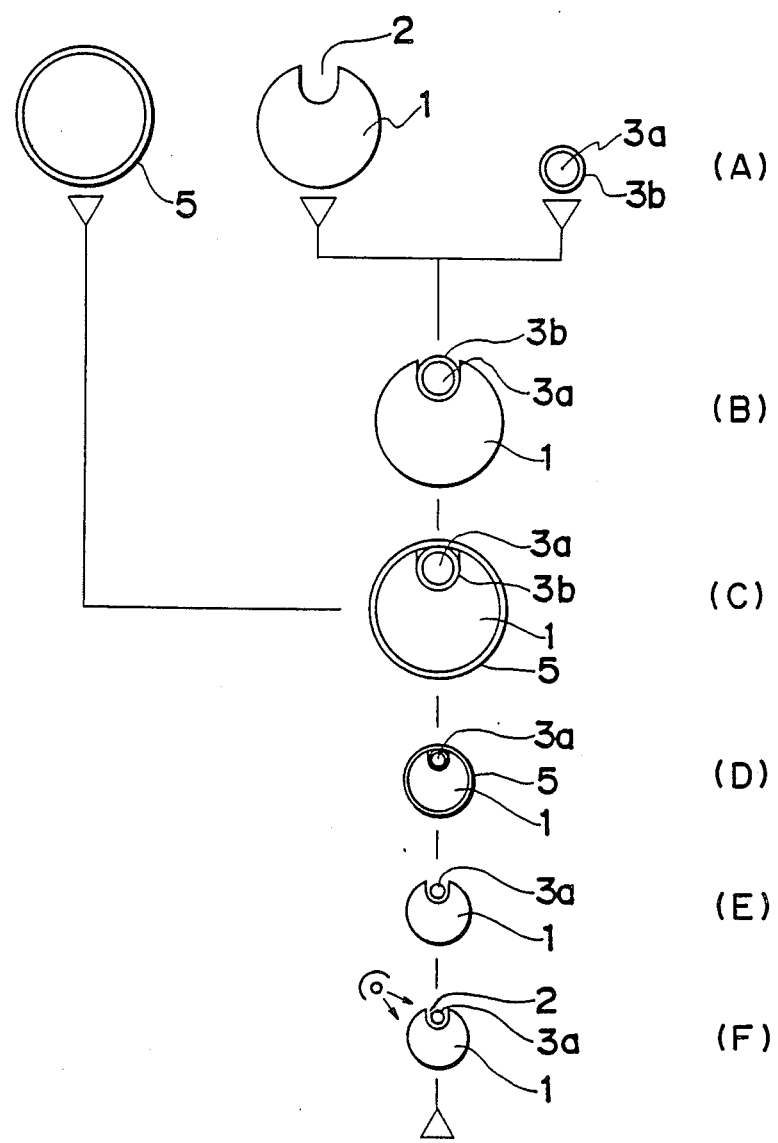
FIG. 3 is a schematic diagram showing a process of a method of the production of the superconductor wire shown in FIG. 1.

FIG. 3 shows a process of making the composite ceramic superconductor wire 10 of the present invention, wherein an elongated superconductor material 3a covered with Cu layer 3b and a basic material is of the reinforcing member 1 with the groove 2 are prepared in the step A. The elongated superconductor material 3a is accommodated in the groove 2 in the step B and in turn the reinforcing member 1 with the elongated superconductor material 3a is covered by a Cu pipe 5 in the step C. Then the entire body is subjected to a wire drawing process in the step D so that the superconductor wire assembly is drawn and extended to the wire having a desired outer diameter. Then the Cu pipe 5 and Cu layer 3b are removed by a chemical treatment in the step E, and the ceramic superconductor wire assembly is subjected to a thermal process in the step F with a temperature higher than 900° C. for at least a several hours, whereby the composite superconducting wire shown in FIGS. 1 and 2 mentioned above can be obtained.

As the ceramic superconductor basic material, there may be used simple substance or compound thereof so far as the substance contains material and/or materials which show superconductor property.

In performing the thermal treatment, there occurs shrinkage of the elongated superconductor material and there could be formed a gap between the elongated superconductor material 3a and the reinforcing member 1 and therefore, $O_2$ can be sufficiently supplied to the gap, so that a good superconductor property could be obtained. Specifically, the critical temperature of the superconductor wire was 91° K.

In the example mentioned above, in place of using the Cu pipe, Al or Ag pipe may be used.

Figure 7:
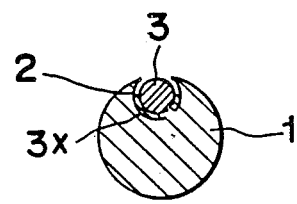
FIG. 7 is a cross sectional view showing a still further example of the superconductor wire according to the present invention.

In the process of removing the Cu pipe mentioned above, a part 3x of the Cu pipe covering the elongated superconductor material 3a at the bottom of the groove 2 may not be removed but the upper half portion of the Cu pipe is removed as shown in FIG. 7.

Figure 4:
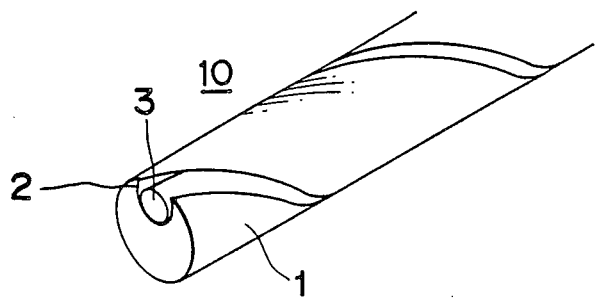
FIG. 4 is a perspective view showing another example of the superconductor wire according to the present invention, wherein the ceramic superconductor is fitted in a spiral groove.

FIG. 4 shows another embodiment of the composite superconductor wire of the present invention, wherein the groove 2 is formed in a spiral manner on the cylindrical surface of the reinforcing member 1.

In the embodiment shown in FIG. 4, similar to the embodiment shown in FIGS. 1 and 2, it becomes possible to handle the composite superconducting wire 10 by man's hand and it is also possible to manufacture the composite superconducting wire of long size.

Moreover, the length of the composite superconducting wire can be increased easily relative to the embodiment shown in FIG. 1 by making the elongated superconductor material 3 to extend in a spiral shape around the cylindrical surface of the reinforcing member 1. Moreover, in case the elongated superconductor material 3 is shrunk in the spiral groove 2, the elongated superconductor material 3 is pressed to the bottom of the groove 2 so that the elongated superconductor material 3 can be tightly integrated with the reinforcing member 1.

With respect to the process for manufacturing the composite superconducting wire shown in FIG. 4, even when the reinforcing member with the straight groove is used, it is sufficient to add a twisting process between the wire drawing process and cover removing process, so that it is possible to make the manufacturing process as simple as possible.

Figure 5:
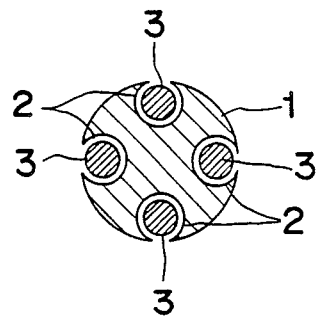
FIG. 5 is a cross section view showing a further example of the superconductor wire according to the present invention, wherein the ceramic superconductors are filled in four grooves.

FIG. 5 shows a further example of the composite superconducting wire of the present invention, wherein four grooves 2 are formed in the reinforcing member 1. The grooves 2 are respectively separated by the same angular distance. The elongated ceramic superconductor wires 3 are accommodated in the respective grooves 2. In the composite superconducting wire shown in FIG. 5, the various advantages mentioned above can be attended. In addition, the number of the grooves 2 that is the number of the elongated superconductor material may be increased up to about 15 or 16.

Figure 6:
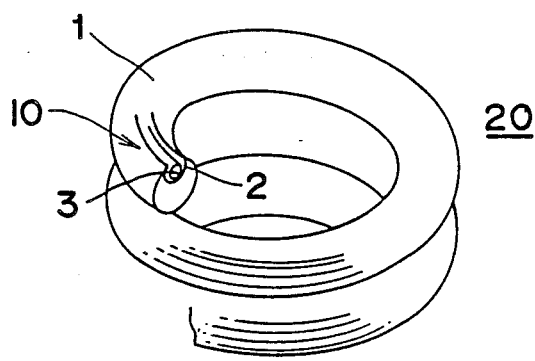
FIG. 6 is a perspective view showing a still further example of the coiled superconductor wire according to the present invention.

FIG. 6 shows a further example of the composite superconducting wire of the present invention, wherein the reinforcing member 1 is formed in a spiral shape. In the example shown in FIG. 6, a coil having a desired number of turn can be manufactured easily.

As to the manufacturing process, the composite superconducting wire shown in FIG. 6 can be manufactured by only adding a process of twisting the reinforcing member 1 between the drawing process and cover removing process so that the grooves are shaped in a spiral shape. However, the spiral shaping may be made after the superconducting wire assembly is completed.

Figure 8:
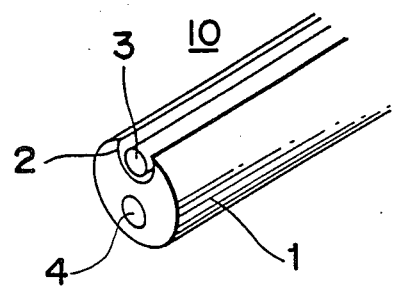
FIG. 8 is a perspective view showing a still further example of the superconductor wire according to the present invention.
Figure 9:
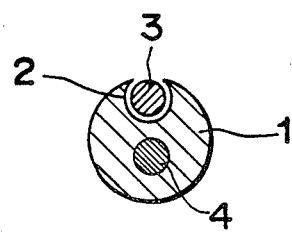
FIG. 9 is a cross sectional view of the superconductor wire shown in FIG. 8.
Figure 10:
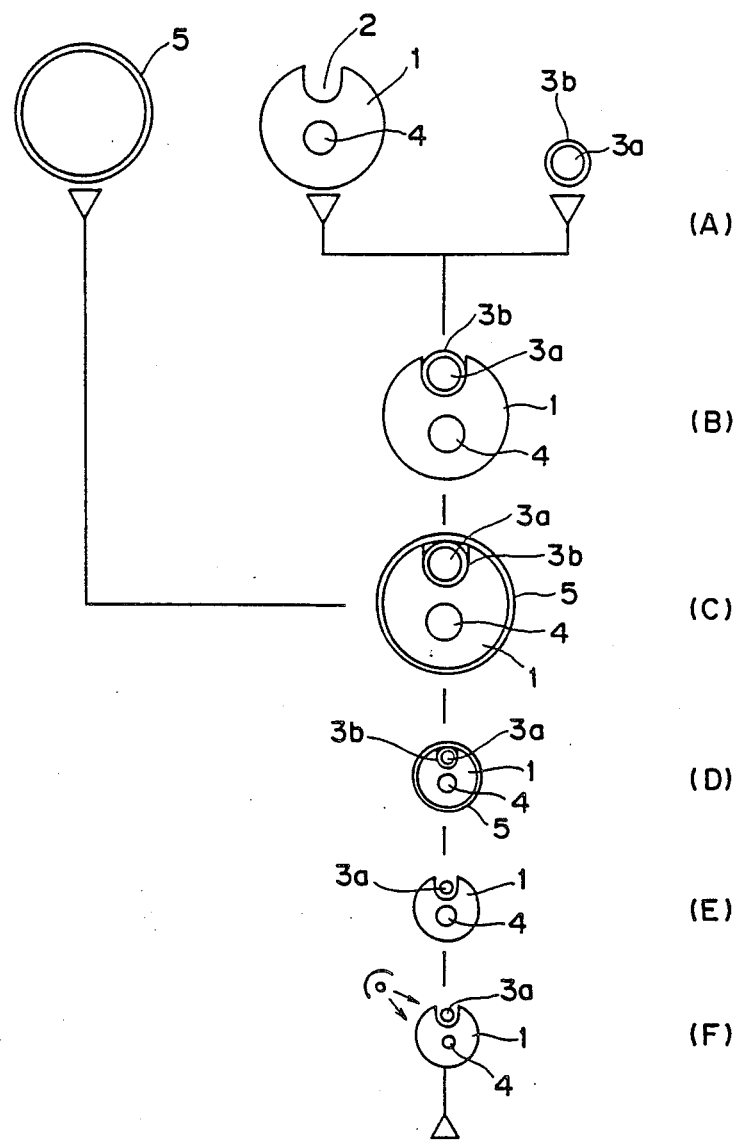
FIG. 10 is a schematic view showing a process of the production of the superconductor wire shown in FIG. 8.

In a further example of the composite superconducting wire, there may be added a stabilizing conductor 4 made of Cu so as to extend in the central portion of the reinforcing member 1 as shown in FIGS. 8 to 10. In the embodiment, since the stabilized conductor 4 is laid in the reinforcing member 1, in case the elongated superconductor material 3 is formed to the normal conductive condition, the current mainly flows through the stabilizing conductor 4, whereby it is possible to prevent the superconductor wire from being burned out.

FIG. 10 shows the respective processes for manufacturing the composite superconducting wire shown in FIG. 8 which is similar to those shown in FIG. 3 except that the stabilizing member 4 is situated in the reinforcing member 1.

In a further example of the composite superconducting wire, as the elongated superconductor material, a plurality of superconductor filaments (generally shown in the reference numeral 3) which are twisted may be used as shown in FIGS. 11 to 14. The twisted superconductor filaments may be obtained in such a manner that after a plurality of superconductor filaments are formed using the ceramic superconductor basic material, the superconductor filaments are twisted and subjected to a heat treatment with a temperature higher than 900° C.

Figure 11:
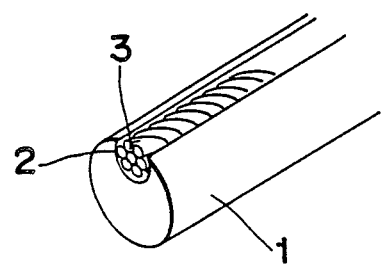
FIG. 11 is a perspective view showing a still further example of the superconductor wire according to the present invention; wherein a plurality of ceramic superconductor filaments are fitted in the groove.
Figure 12:
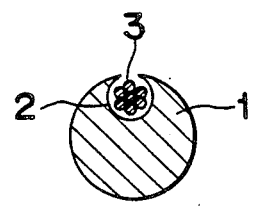
FIG. 12 is a cross sectional view of the superconductor wire shown in FIG. 11.
Figure 13:
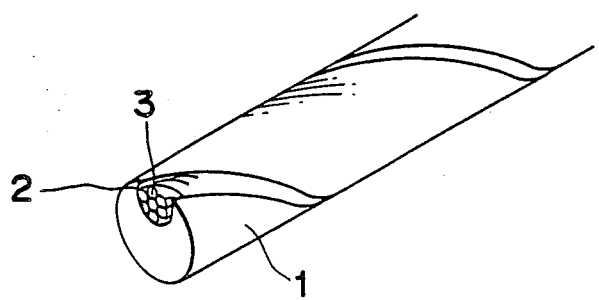
FIG. 13 is a perspective view shown a still further example of the superconductor wire according to the present invention, wherein the superconductor filaments are fitted in the spiral groove.
Figure 14:
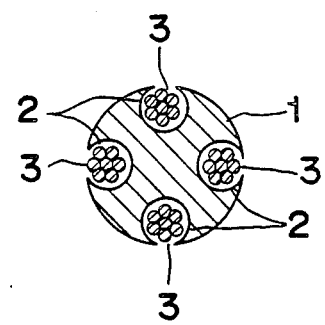
FIG. 14 is a cross sectional view showing a still further example of the superconductor wire according to the present invention, wherein the superconductor filaments are fitted in four grooves.

The manufacturing process of the composite superconducting wire shown in FIG. 11 is similar to that shown in FIG. 3 except that the twisted superconductor filaments are accommodated in the groove 2.

In the example shown in FIGS. 11 to 14, since the superconductor filaments are twisted, distortion of the filaments due to shrinkage at the time of sintering process can be effectively eliminated.

Figure 15:
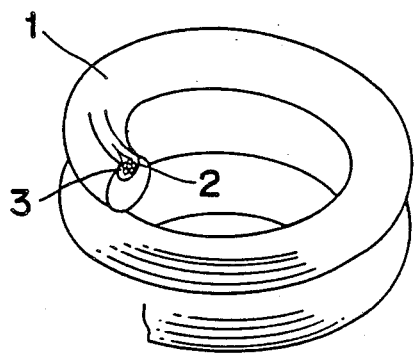
FIG. 15 is a perspective view showing a still further example of the superconductor wire according to the present invention, wherein the superconductor wire shown in FIG. 13 is formed in a coil.

FIG. 15 shows a coiled composite superconducting wire using the twisted superconductor filaments mentioned above.

Figure 16:
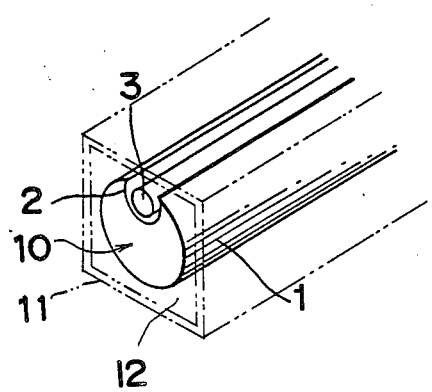
FIG. 16 is a perspective view showing a still further example of the superconductor wire according to the present invention, wherein the superconductor wire is accommodated in an outer enclosure.
Figure 17:
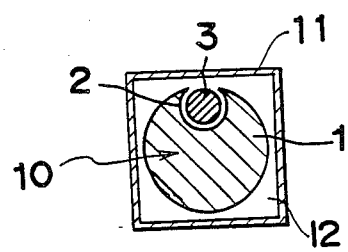
FIG. 17 is a cross sectional view showing the superconductor wire shown in FIG. 16.

FIGS. 16 and 17 shows a still further example of the composite superconducting wire. The composite superconducting wire 10 composed of the reinforcing member 1 and the elongated superconductor material 3 accommodated in the groove 2 shown in FIG. 1 is accommodated in an outer enclosure 11 made of stainless steel with a generally rectangular shape as shown, so that there is provided a space 12 for flowing the cooling medium around the composite superconducting wire 10.

In the example shown in FIGS. 16 and 17, liquid nitrogen is passed through the space 12 surrounded by the outer enclosure 11 along the composite superconducting wire 10 so that since the temperature of the liquid nitrogen is lower than the critical temperature of the ceramic superconductor wire, the composite superconducting wire 10 can be kept lower than its critical temperature.

In the example shown in FIGS. 16 and 17, the composite superconducting wire 10 may be produced in the same process shown in FIG. 3. After the composite superconducting wire 10 is produced, four flat sheets for making the outer enclosure 11 is supplied continuously and the sheet is welded, so that there can be produced the outer enclosure 11 having a size larger than the diameter of the reinforcing member 1 for flowing the cooling medium. The shape of the enclosure 11 is not limited to the rectangular shape but may be selected round shape as desired. When the flat sheets are welded, the rectangular enclosure 11 may be produced, when arcuated sheets are welded, a round enclosure or eliptical enclosure may be produced.

Figure 18:
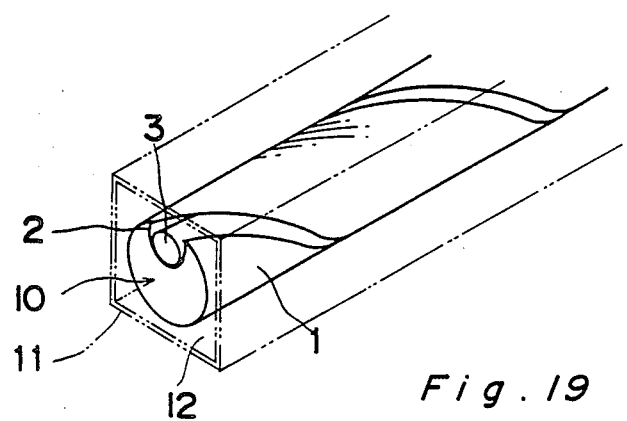
FIG. 18 is a perspective view showing a still further example of the superconductor wire according to the present invention, wherein the spiral superconductor wire is accommodated in an outer enclosure.
Figure 19:
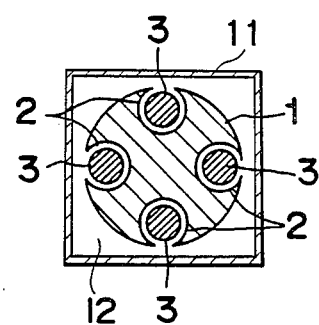
FIGS. 19 and 20 are cross sectional view showing a still further example of the superconductor wire according to the present invention wherein the superconductor wire is accommodated in an outer enclosure.
Figure 21:
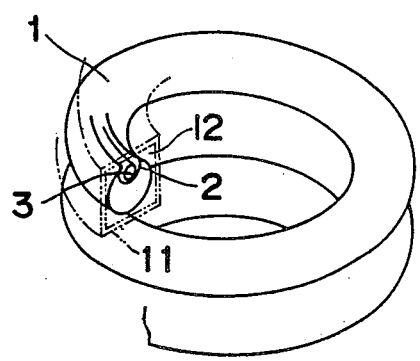
FIG. 21 is a perspective view showing a coil of the superconductor wire according to the present invention, wherein the superconductor wire is accommodated in an outer enclosure.
Figure 20:
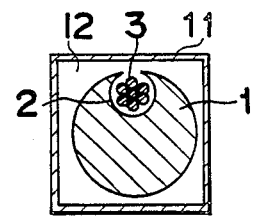

FIG. 18 shows a still further example of the composite superconducting wire of the spiral shape which is accommodated in the outer enclosure 11. The composite superconducting wire per se is the same as that shown in FIG. 4. Similarly in the example shown in FIG. 19, the composite superconducting wire shown in FIG. 5 in which a plurality of the elongated superconductor materials 3 are accommodated respectively in the grooves 2 of the reinforcing member 1 is accommodated in the outer enclosure 11. In the example shown in FIG. 21 the superconductor wire shown in FIG. 12 in which the twisted superconductor filaments 3 are accommodated in the groove 2 of the reinforcing member 1 is accommodated in the outer enclosure 11. In the example shown in FIG. 20, the surface area of the composite superconducting wire to be contacted with the liquid nitrogen can be increased and therefore, cooling effect of the composite superconducting wire can be increased. FIG. 21 shows an example of a coiled composite superconducting wire using the various examples of the composite superconducting wire shown in FIGS. 16 to 20.

Figure 22:
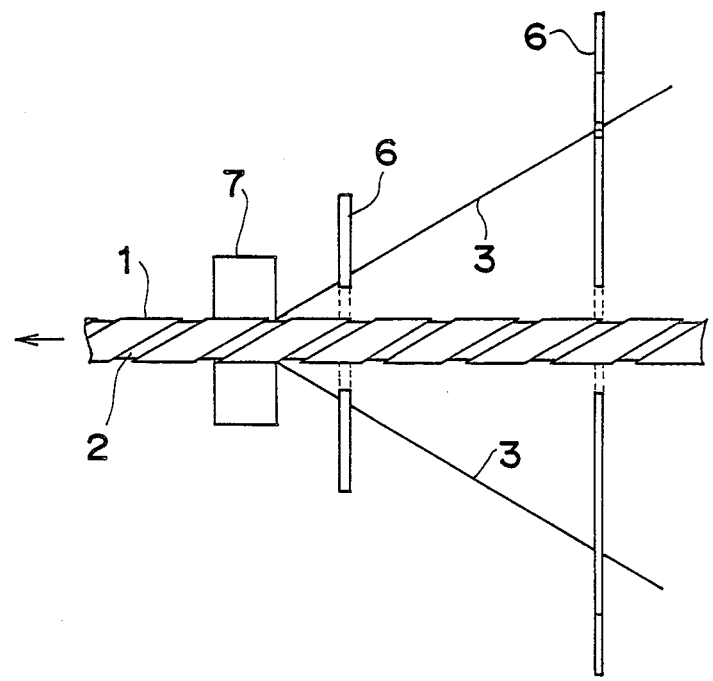
FIG. 22 is a schematic view showing an example of an apparatus for fitting the superconductor in the groove.

FIG. 22 shows an essential structure of an apparatus for fitting in the elongated superconductor material 3 in the spiral groove 2 of the reinforcing member 1 in order to manufacture the composite superconducting wire as shown in FIG. 4 in which the elongated superconductor material 3 is fitting in the spiral groove 2. A pair of wire guiding plates 6 and a collecting die 7 are disposed at respective positions. The elongated superconductor material 3 is supplied to the wire collecting die 7 through the wire guiding plates 6, when the reinforcing member 1 is rotated around the longitudinal axis thereof and advanced in the direction shown by the arrow mark. Since the elongated superconductor material 3 has a suitable flexibility, the elongated superconductor material 3 can be fitted in the groove 2. In case the elongated superconductor material is covered by Cu pipe 3b, the process to fit the elongated superconductor material 3 in the groove 2 can be made more easily.

The elongated superconductor material 3 having a suitable flexibility may be produced by mixing the alcoholic solvent in the superconductor material, then the superconductor material is spun in the wire shape by the Doctor brade method (slip casting method). In this case, since the elongated superconductor material has a sufficient flexibility, the elongated superconductor material can fit in the groove 2 without Cu pipe. The alcoholic solvent is volatilized when the wires are subjected to the thermal process, and the superconductor property is not harmed by the alcoholic solvent.

The groove 2 of the reinforcing member 1 may be formed by a cutting process.

There may be obtained a long size composite superconducting wire by connecting the respective Cu pipes 5 of the respective composite superconducting wires in series being TIG welding, MIG welding method or high frequency welding method.

In order to provide the composite superconducting wire as shown in FIG. 4 in which the elongated superconducting material 3 is accommodated in the spiral shape groove, the reinforcing member having the groove 2 extending straightly in place of using the spiral groove.

Figure 23:
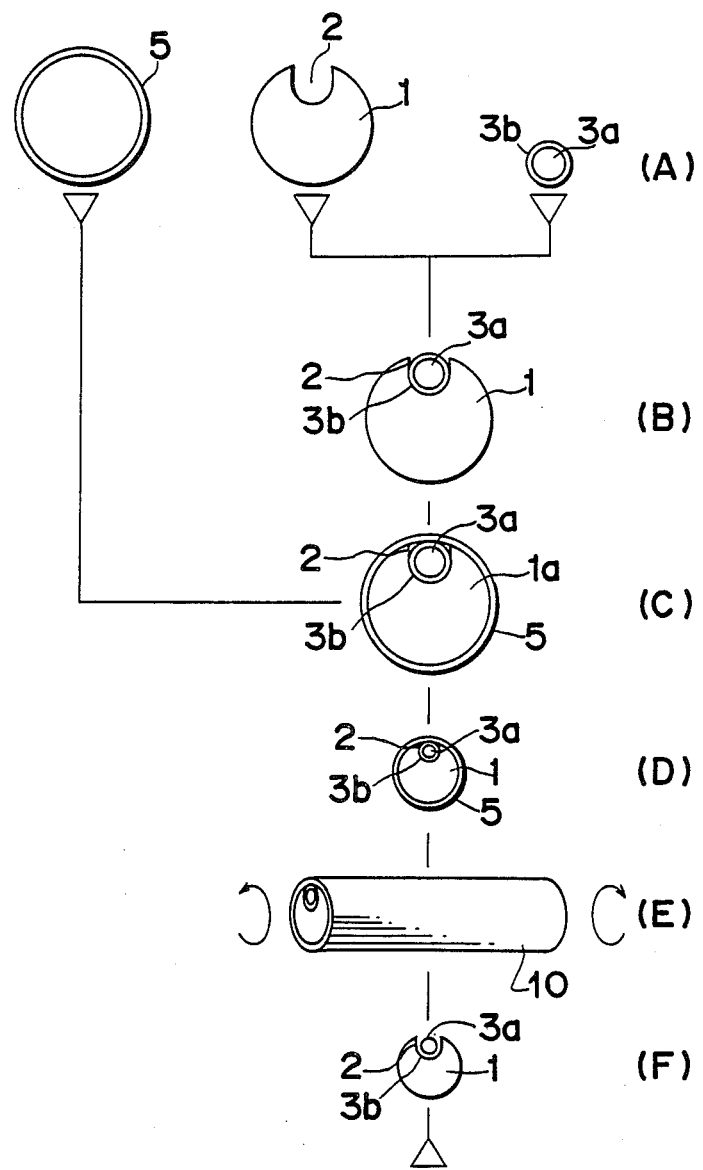
FIGS. 23 to 30 are respectively schematic diagrams showing various examples of the process of the production of the superconductor wire according to the present invention.

FIG. 23 shows an example of the second method of the production of the composite superconducting wire as shown in FIG. 4 using the reinforcing member having a straight groove. In the method shown in FIG. 23, the method is similar to the method shown in FIG. 3 except that a twisting process (step (E) in FIG. 23) is added between the wire drawing step (step D in FIG. 23) and Cu pipe removing step (step F in FIG. 23).

In the example shown in FIG. 23, the drawn superconductor wire assembly is twisted around the longitudinal axis of the superconductor wire 10 so that the groove 2 and the elongated superconductor material 3 is shaped in the spiral shape as shown in FIG. 4. The twisted superconductor wire assembly is subjected to the thermal treatment after the Cu cover is removed.

Figure 24:
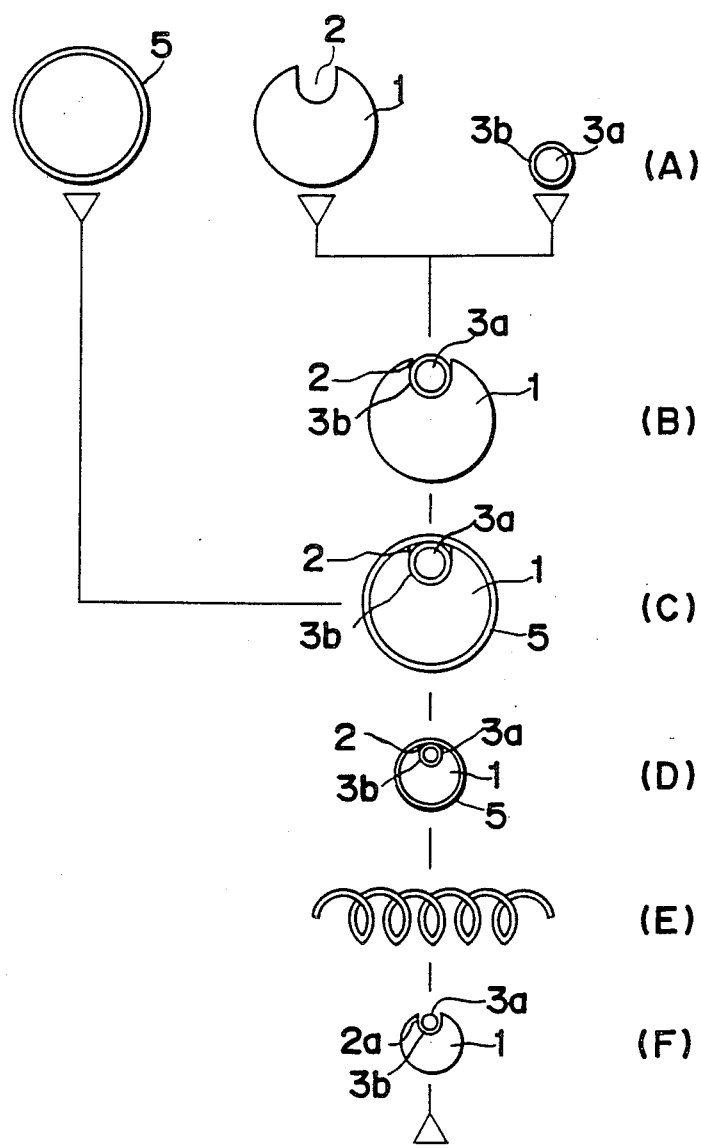

FIG. 24 shows an example of the third method of the production of the coil 20 (see FIG. 6) of the composite superconducting wire 10 using the reinforcing member having a straight groove. In the method shown in FIG. 24, the method is similar to the method shown in FIG. 3 except that a coiling process (step (E) in FIG. 24) is added between the wire drawing step (step D in FIG. 24) and Cu pipe removing step (step F in FIG. 24).

In the example shown in FIG. 24, the reinforcing member 1 with the elongated superconducting material 3 is bent into a coil shape to form one or more of turn coil as shown in FIG. 6. The composite superconducting wire 10 shaped in the coil is subjected to the thermal treatment after the Cu cover is removed whereby the superconductor coil having the desired turns can be obtained.

Figure 25:
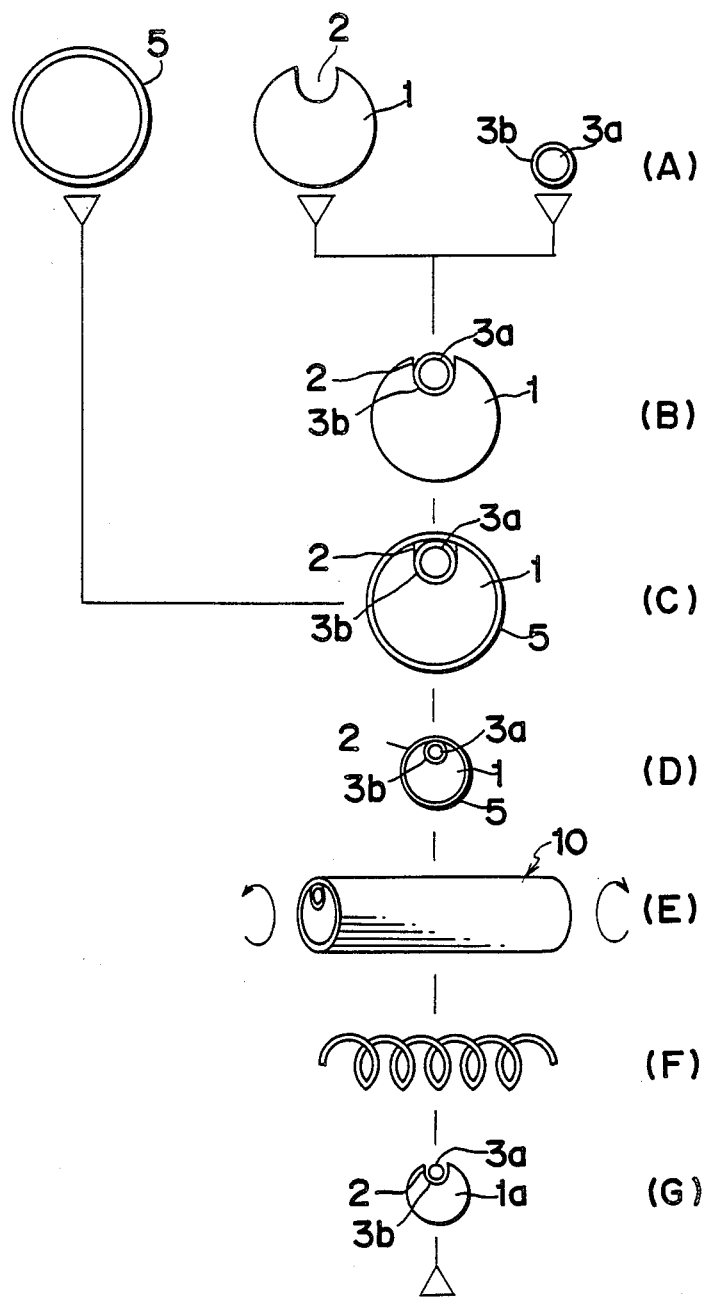

FIG. 25 shows an example of the fourth method of the production of the composite superconducting wire using the reinforcing member having a straight groove. In the method shown in FIG. 25, the method is similar to the method shown in FIG. 23 except that a twisting step (step E in FIG. 25) is added between the wire drawing step (step D in FIG. 25) and coiling step (step F in FIG. 25).

In the example shown in FIG. 25, the drawn superconductor wire assembly is twisted so that the groove 2 and the elongated superconductor material 3 is shaped in the spiral shape as shown in FIG. 4. Then the twisted superconducting wire 10 is bent in the coiled shape. The bend superconductor wire assembly is subjected to the thermal treatment after the Cu cover is removed, whereby the coil having the desired turns with the composite superconducting wire twisted in the spiral shape can be obtained.

In the various production methods mentioned above, it may be possible to change the position and number of the grooves and the elongated superconductor material as shown in FIGS. 1 to 20 and other than those shown therein. Also it is possible to select the critical temperature of the superconductor wire or wires as desired by selecting the material of the superconductor wire. Also it is possible to select the length and/or the number of turns of the coil of the composite superconducting wire as desired by selecting length of the reinforcing member 1. It is further possible to produce the composite superconducting wire in which the superconductor wire coated with Al which is meltable at the time of the thermal treatment of the superconductor wire material or the superconductor wire coated with Ag which allows to transmit $O_2$ is used and only the outer pipe is (such as Cu pipe 5) is removed.

Figure 26:
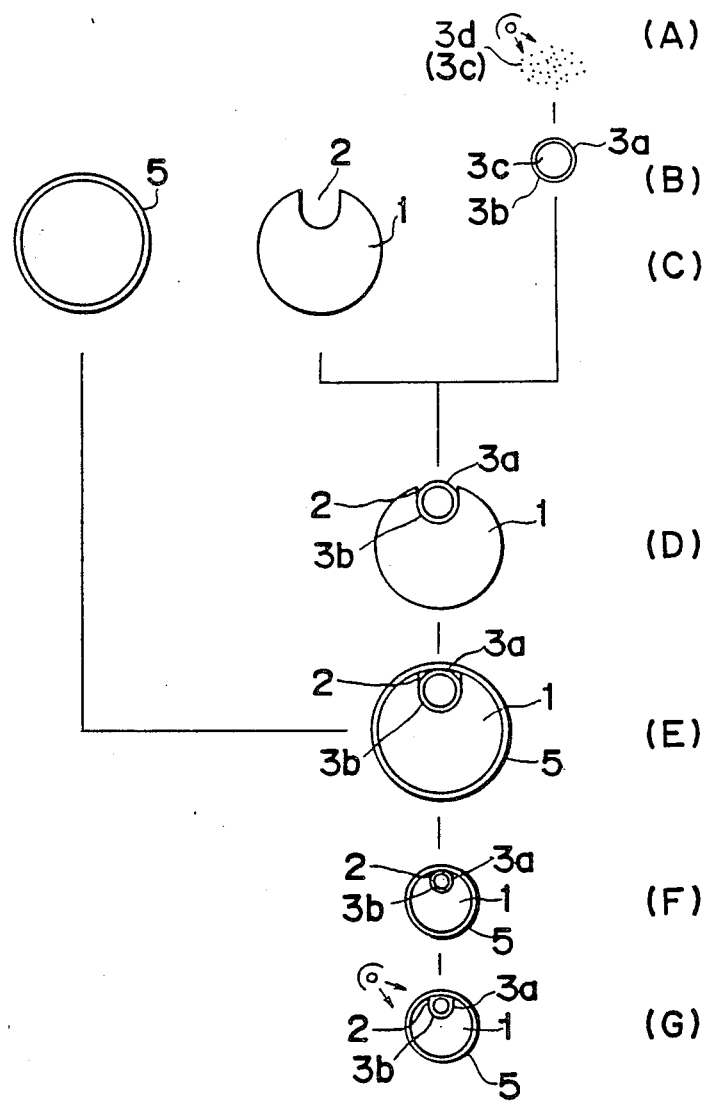

FIG. 26 shows a further example of the method of the production of the composite superconducting wire. In the step A of FIG. 26, superconductor powder 3d is preliminarily heated and sintered with a temperature higher than 900° C. for 10 to 20 hours, so that there is obtained the preliminarily sintered ceramic superconductor substance 3C having the structure $Y_1 Ba_2 Cu_3O_{7-x}$ with the critical temperature 91° K.). The preliminarily sintered substance is broken in powder. The powder is accommodated in the pipe 3b of Al and the pipe 3b with the ceramic superconductor powder is accommodated in the groove 2. The steps C to E of FIG. 26 are similar to those shown in the example of FIG. 3. After the reinforcing member 1 with the elongated superconductor material 3 is drawn into an elongated wire as shown in the step F of FIG. 26, the superconductor wire assembly with the outer pipe 5 is subjected to thermal treatment with the temperature higher than 900° C. for several hours.

By the method shown in FIG. 26, there can be obtained the superconductor wire in which the ceramic elongated superconductor material 3 covered by Al is accommodated in the groove 2 formed on the cylindrical surface portion of the reinforcing member 1 made of stainless steel or the like and the composite superconducting wire is covered by the outer pipe 5 made of Cu or stainless steel.

In the method shown in FIG. 26, since the elongated superconductor material 3 is already preliminarily sintered to have the desired superconductor property, there is no need to supply $O_2$ in the step G, so that it is possible to decrease the number of the control elements for enabling the process to be simple. In this example, the critical temperature of the composite superconducting wire was 91° K.

Figure 27:
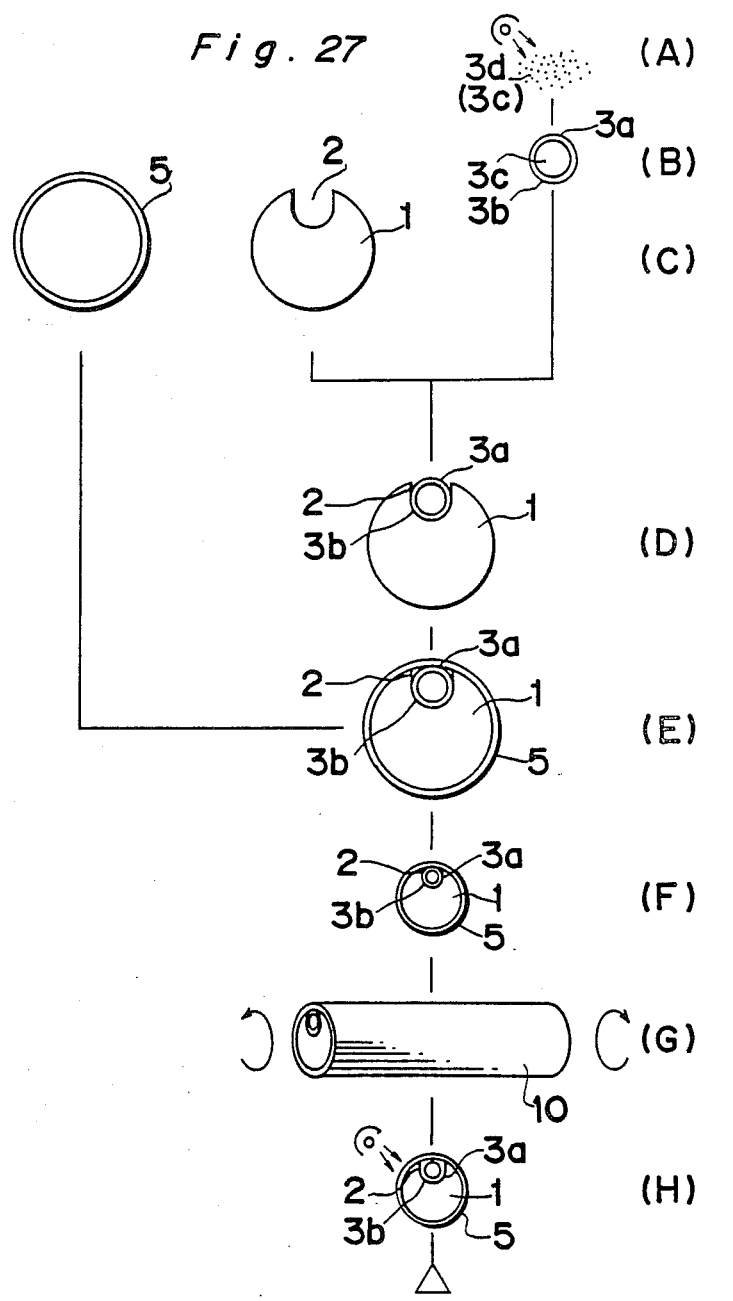

FIG. 27 shows a further example of the method of the production of the composite superconducting wire. In the method shown in FIG. 27, the method is similar to the method shown in FIG. 26 except that a twisting process (step (G) in FIG. 27) is added between the wire drawing step (step F in FIG. 26) and the thermal treatment step (step G in FIG. 26).

In the example shown in FIG. 27, the drawn superconductor wire assembly is twisted so that the groove 2 and the elongated superconductor material 3 are shaped in the spiral shape as shown in FIG. 4.

Figure 28:
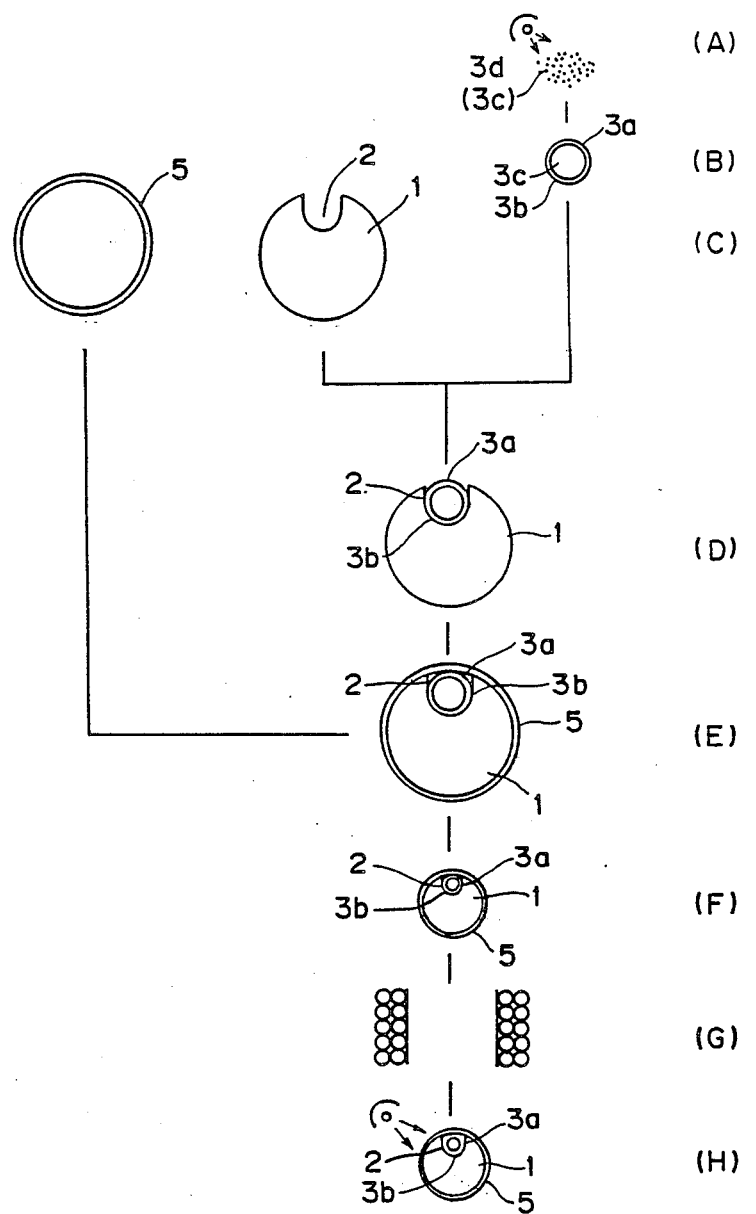

FIG. 28 shows an example of the second method of the production of the composite superconducting wire. In the method shown in FIG. 28, the method is similar to the method shown in FIG. 27 except that a coiling process (step (G) in FIG. 28) is put in place of the twisting step (step G in FIG. 27.

In the example shown in FIG. 28, the drawn superconductor wire assembly is coiled so that the composite superconducting wire in the coil shape can be obtained. The coiled superconductor wire assembly is subjected to the thermal treatment, the coil of the composite superconducting wire having the desired number of turns can be obtained.

Figure 29:
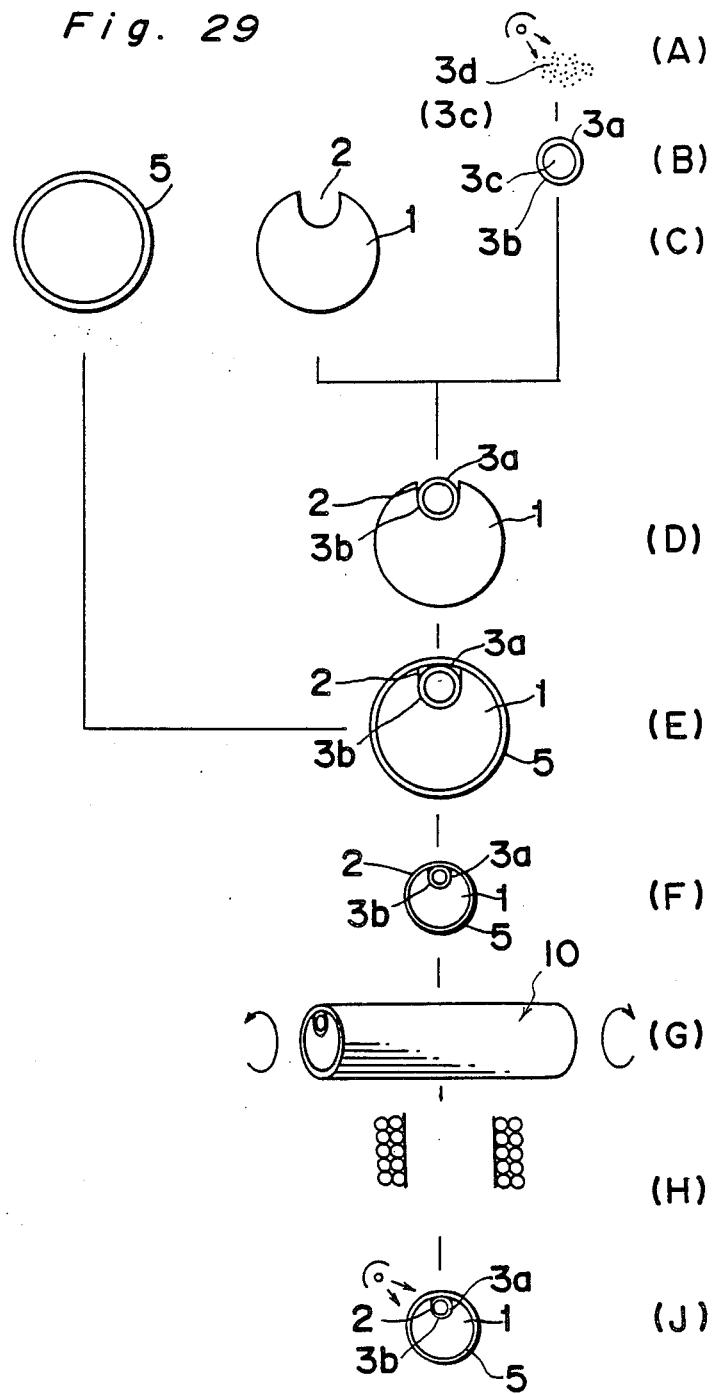

FIG. 29 shows a further example of the method of the production of the composite superconducting wire. In the method shown in FIG. 29, the method is similar to the method shown in FIG. 27 except that a twisting process (step (G) in FIG. 29) is added between the wire drawing step (step F in FIG. 27) and the coiling step (step G in FIG. 27).

In the example shown in FIG. 29, the drawn superconductor wire assembly is twisted so that the groove 2 and the superconductor wire 3 is shaped in the spiral shape as shown in FIG. 4 and the composite superconducting wire can be coiled.

In the various production methods shown in FIGS. 27 to 29, it may be possible to change the position and number of the grooves and the elongated superconductor material 3 as shown in FIGS. 1 to 20 and other than those shown therein. Also it is possible to select the critical temperature of the superconductor wire or wires as desired by selecting the material of the superconductor wire. Also it is possible to select the length and/or the number of turns of the coil of the composite superconducting wire as desired by selecting length of the reinforcing member 1. It is further possible to prevent the oxidation of the outer pipe 5 by performing the thermal treatment by keeping the outside of the outer pipe 5 in vacuum or reductive atmosphere such as $H_2$ atmosphere. Moreover, in the examples shown in FIGS. 27 and 29, it is possible to perform a further wire drawing treatment after the twisting treatment.

Figure 30:
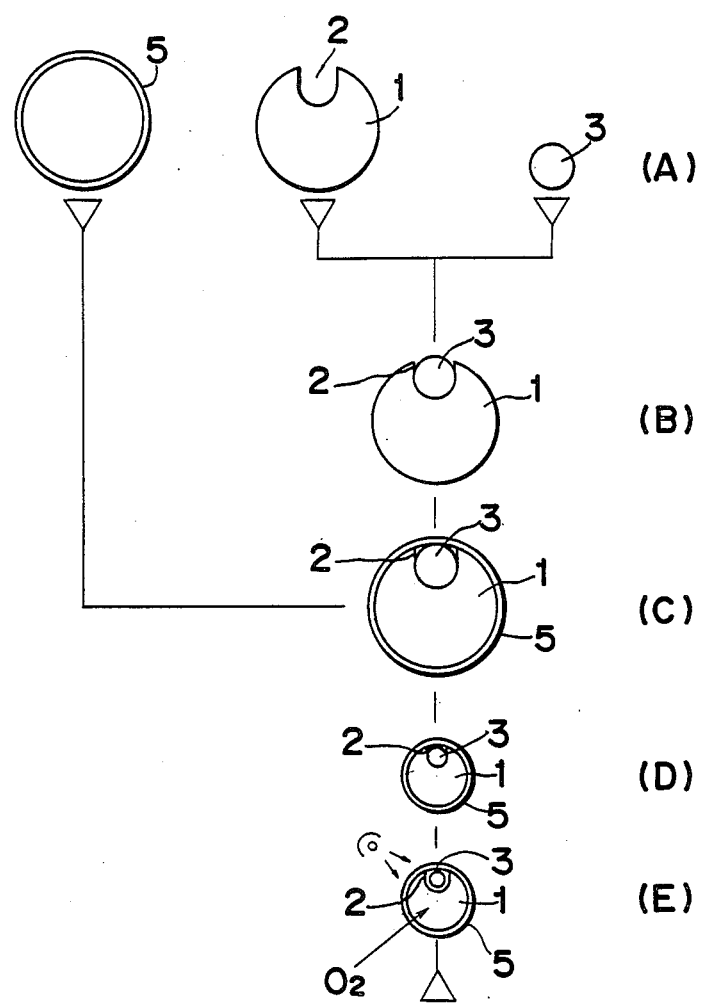
Figure 31:
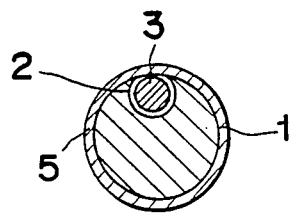
FIGS. 31 to 33 are cross sectional view showing various examples of the superconductor wire covered with an outer pipe.

FIG. 30 shows a still further example of the method of the production of the composite superconducting wire. The steps A to D in FIG. 30 are similar to those shown in FIG. 23. Following the wire drawing process, the elongated superconductor wire assembly is subjected to a thermal processing as shown the step E of FIG. 30 supplying $O_2$ from the end of the Cu pipe 5 so as to obtain the composite superconducting wire covered with Cu pipe 5 as shown in FIG. 31. In performing the thermal processing as shown in FIG. 30 E, the ceramic elongated superconductor material 3 is shrunk to decrease the cross sectional area of the elongated superconductor material 3, so that there is formed a gap between the reinforcing member 1 and the elongated superconductor material 3 and between the Cu pipe 5 and the elongated superconductor material 3, whereby $O_2$ can be sufficiently supplied to the gap and a good superconductor property can be obtained.

Figure 32:
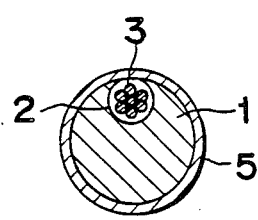

When a bundle of twisted elongated superconductor material is accommodated in the grove 2, and the method shown in FIG. 30 is performed, the composite superconducting wire as shown in FIG. 32 can be obtained.

Figure 33:
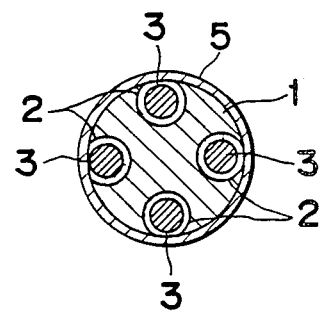

When there are formed four grooves 2 on the reinforcing member 1, and the method shown in FIG. 30 is performed, the composite superconducting wire as shown in FIG. 33 wherein the four wires 3 are covered with the Cu pipe 5 can be obtained.

Figure 34:
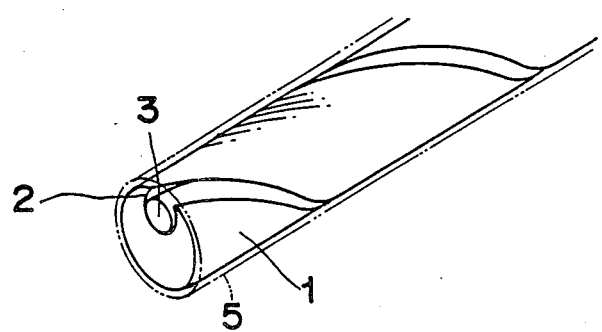
FIG. 34 is a perspective view showing a further example of the superconductor wire according to the present invention.

In the method shown in FIG. 30, the groove 2 may be shaped in the spiral shape as shown in FIG. 34 with the outer surface of the superconductor wire assembly covered with the Cu pipe 5 which is shown in phantom lines.

Figure 35:
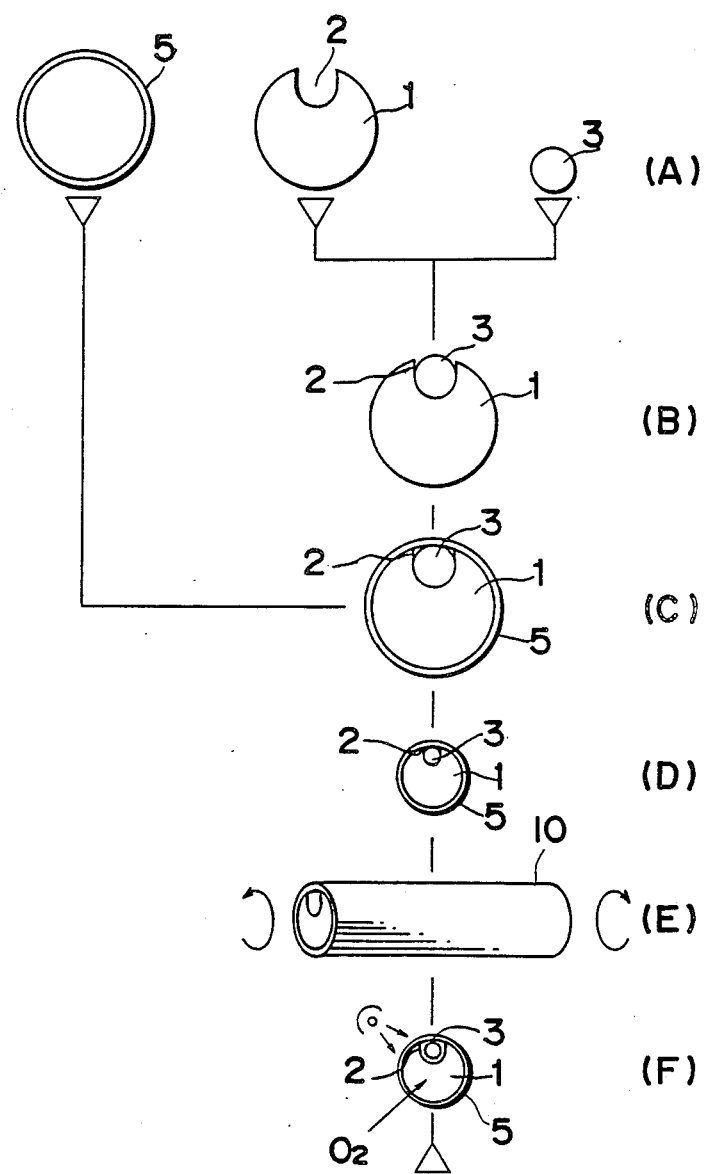
FIGS. 35 to 37 are respectively show examples of the methods of the production of the superconductor wires according to the present invention.

FIG. 35 shows a further example of the method of the production of the composite superconducting wire, wherein the twisting process shown by the step E of FIG. 35 are added in the method shown in FIG. 30.

Figure 36:
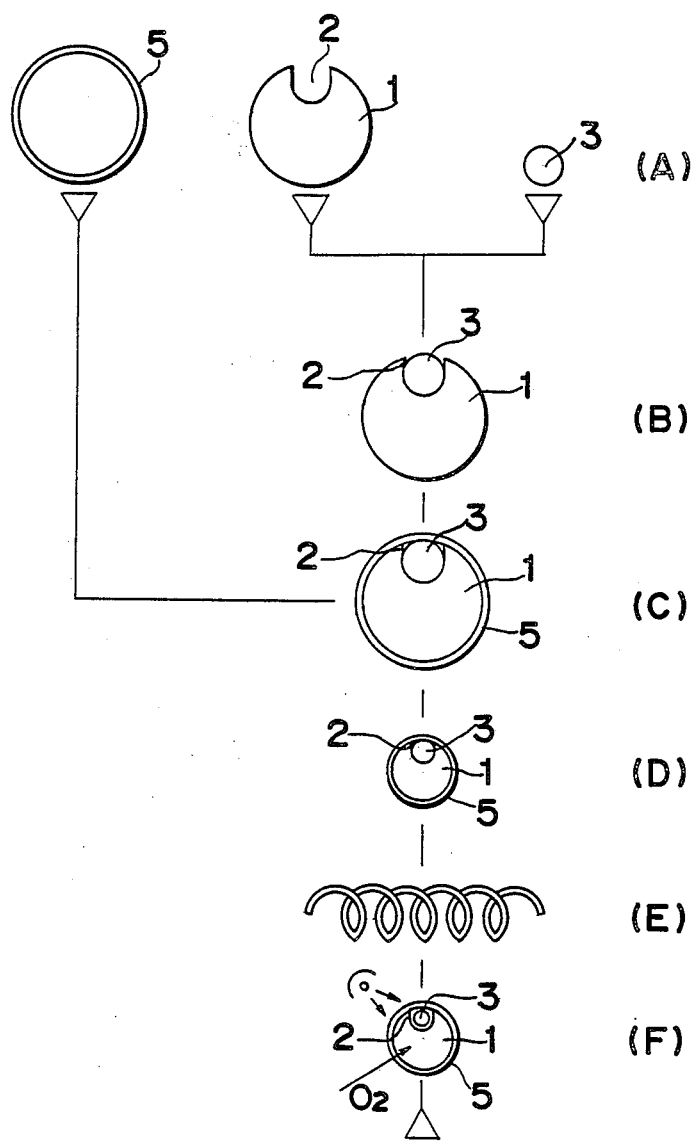

FIG. 36 shows a further example of the method of the production of the composite superconducting wire, wherein the coiling process shown by the step E of FIG. 36 is added to the method shown in FIG. 30 so as to make the coil of the composite superconducting wire covered with the Cu pipe 5.

Figure 37:
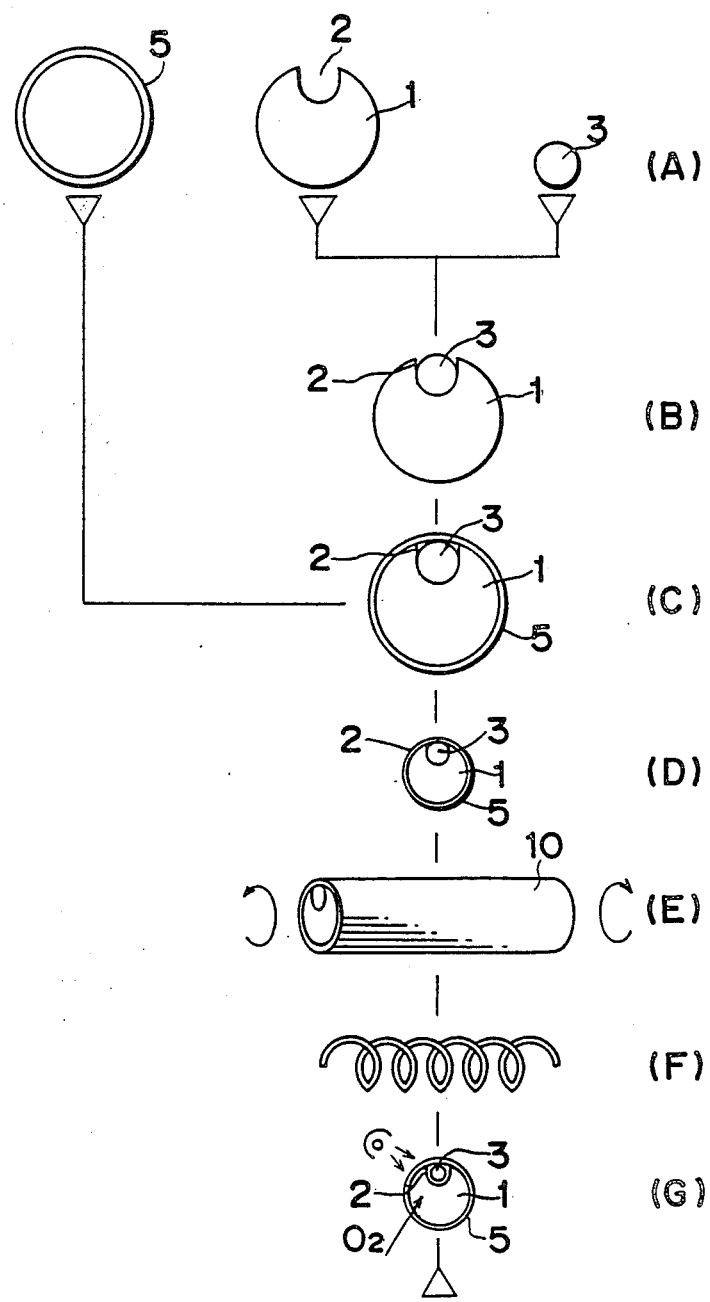

FIG. 37 shows a further example of the method of the production of the composite superconducting wire, wherein the twisting process shown by the step E and coiling step of F of FIG. 37 are added in the method shown in FIG. 30.

In the present invention, various variations can be made. For example, the stabilizing member 4 shown in FIGS. 8 to 10 may be formed around the reinforcing member 1. When the stabilizing member is situated at the central portion of the reinforcing member 1, the stabilizing member 4 may be made such material having a low resistance with a melting point higher than the sintering point of the ceramic superconductor wire material. In this case, as the material of the stabilizing member 4, there may be used Cu, Ag, Al and their alloy and their composite material. When the stabilizing member is formed around the reinforcing member, the stabilizing member 4 may be integrally made with the reinforcing member using such material which is not reacted with the ceramic superconductor wire material and has a low resistance. In this case, since the ceramic superconductor wire material and the stabilizing member can be directly contacted, their contact resistance may be decreased. Moreover, in this case, as the material of the stabilizing member, there may be used Al covered stainless steel, Ag covered stainless steel and Au covered stainless steel. When Al covered stainless steel is used, by setting the sintering temperature of the ceramic superconductor wire material to be higher than 900° C., since the Al layer is molten at the thermal treatment process of the superconductor wire, the ceramic superconductor wire material can be fixed tightly in the groove.

As the elongated superconductor wire material to be accommodated in the groove, there may be used such superconductor wire that the superconductor wire material is covered with Al layer and the Al covered superconductor wire material is subjected to a thermal process with a temperature higher than 900° C. In this case, since the Al layer is molten at the time of the thermal process and the Al is cured finally, the elongated ceramic superconductor wire material can be maintained stabilized in the groove.

As the elongated superconductor wire material to be accommodated in the groove, there may be used such elongated ceramic superconductor wire material covered by Ag layer of Cu layer. When the ceramic superconductor wire material is covered with Ag, $O_2$ can be sufficiently supplied to the ceramic superconductor material through the Ag layer at the time of the thermal process of the superconductor wire assembly.

When performing the thermal process in the examples shown in FIGS. 30, 35, 36 and 37, in place of supplying $O_2$, the substance C defined in the equation (1) may be supplied from the end of the outer pipe 5.

What is claimed is:

1. A composite superconducting wire which comprises an elongated reinforcing member, at least one groove defined on the surface portion of the reinforcing member so as to extend generally in a longitudinal direction, and ceramic superconductor material accommodated in and extending along said groove, the ceramic superconductor material having a width less than the width of the groove, the groove being open.

2. The composite superconducting wire according to claim 1, wherein said reinforcing member is formed in a spiral shape.

3. The composite superconducting wire according to claim 1, wherein said groove is formed in a spiral shape.

4. The composite superconducting wire according to claim 1, wherein a plurality of grooves are defined on the surface portion of the reinforcing member.

5. The composite superconducting wire according to claim 1, wherein the ceramic superconductor material is formed of a material defined by the following equation:

$$Aa\ Bb\ Cc$$

wherein A denotes at least one element selected from the IA group, IIA group, and IIIB group of th periodic table, B denotes at least one element selected from the IB group, IIB group and IIIA group of the periodic table, and C denotes at least one element selected from the group consisting of oxygen, fluorine, nitrogen, carbon and sulfur.

6. The composite superconducting wire according to claim 1, wherein the reinforcing member is made of a material which does not react during thermal processing of the ceramic superconductor material and has a thermal resistivity against the thermal processing temperature.

7. A composite superconductor wire according to claim 5, wherein the ceramic superconductor material is made of the elements Y, Ba, Cu and O.

8. The composite superconducting wire according to claim 1, wherein said superconductor material is covered by Al.

9. The composite superconductor wire according to claim 1, wherein said superconductor material is covered by Ag.

10. The composite superconducting wire according to claim 1, wherein said superconductor material is covered by Cu.

11. The composite superconducting wire according to claim 1, wherein said superconductor material is made of twisted ceramic superconductors filaments.

12. A composite superconducting wire which comprises an elongated reinforcing member, at least one open groove defined on the surface portion of the reinforcing member so as to extend generally in a longitudinal direction, a ceramic superconductor material accommodated in and extending along said groove, the ceramic superconductor material having a width less than that of the groove, and a stabilizing member contained in the reinforcing member, extending in the longitudinal direction of the reinforcing member.

13. The composite superconducting wire according to claim 12, wherein said stabilizing member is provided at a central portion of the reinforcing member.

14. The composite superconducting wire according to claim 12, wherein said stabilizing member is made of Cu, Ag and/or Al and their alloy or their composite material.

15. The composite superconducting wire according to claim 12, wherein said stabilizing member is formed on the outer peripheral surface of the reinforcing member.

16. A composite superconducting wire which comprises an elongated reinforcing member, at least one open groove defined on the surface portion of the reinforcing member so as to extend generally in a longitudinal direction, a ceramic superconductor material accommodated in and extending along said groove, the ceramic superconductor material having a width less than that of the groove, and an outer enclosure for enclosing said reinforcing member with the ceramic superconductor wire so as to provide a path to allow flow of cooling medium around the reinforcing member.

17. The composite superconducting wire according to claim 16, wherein the ceramic superconductor material is formed of a material defined by the following equation:

$$A_a B_b C_c$$

wherein A denotes at least one element selected from the IA group, IIA group, and IIIB group of the periodic table, B denotes at least one element selected from the IB group, IIB group and IIIA group of the periodic table, and C denotes at least one element selected from the group consisting of oxygen, fluorine, nitrogen, carbon and sulfur.

18. The composite superconducting wire according to claim 16, wherein said wire is formed in a spiral shape.

19. The composite superconducting wire according to claim 18, wherein said groove is formed in a spiral shape.

20. The composite superconducting wire according to claim 16, wherein a plurality of grooves are defined on the surface portion of the reinforcing member.

21. The composite superconducting wire according to claim 16, wherein said reinforcing member is made of a material which does not react during thermal processing of the ceramic superconductor material and has a thermal resistivity against the thermal processing temperature.

* * * * *